United States Patent
Yoon

(10) Patent No.: US 7,358,132 B2
(45) Date of Patent: Apr. 15, 2008

(54) SELF-ALIGNED BIPOLAR SEMICONDUCTOR DEVICE AND FABRICATION METHOD THEREOF

(75) Inventor: Yeo Cho Yoon, Yeongdungpo-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 273 days.

(21) Appl. No.: 11/320,579

(22) Filed: Dec. 30, 2005

(65) Prior Publication Data
US 2006/0148187 A1 Jul. 6, 2006

(30) Foreign Application Priority Data
Dec. 31, 2004 (KR) .................... 10-2004-0117847

(51) Int. Cl.
*H01L 21/8249* (2006.01)
(52) U.S. Cl. ................ 438/235; 438/692; 257/E21.371
(58) Field of Classification Search ................ 438/689, 438/690, 692, 235; 257/E21.371, E29.033
See application file for complete search history.

(56) References Cited

U.S. PATENT DOCUMENTS 6,940,149 B1 * 9/2005 Divakaruni et al. ........ 257/565
6,972,443 B2 * 12/2005 Khater ........................ 257/197

* cited by examiner

*Primary Examiner*—Bradley K Smith
(74) *Attorney, Agent, or Firm*—Lowe Hauptman Ham & Berner LLP

(57) ABSTRACT

A self-aligned bipolar semiconductor device and a fabrication method thereof are provided. After a silicon layer and a collector contact are formed on a buried collector layer, an oxide dummy pattern is formed on the silicon layer to define both an extrinsic base and an intrinsic base. A polycide layer used as the extrinsic base is formed thereon and selectively removed to expose the dummy pattern. After the exposed dummy pattern is removed, an epitaxial layer used as the intrinsic base is grown on both the silicon layer and the polycide layer, and selectively removed from the top of the polycide layer. An oxide layer and a nitride layer are deposited in sequence thereon, and the nitride layer is blanket-etched to form spacers defining an emitter. After a photoresist pattern is formed to mostly cover the oxide layer and partly expose the oxide layer between the spacers over the intrinsic base, the oxide layer is etched by using the photoresist pattern and the spacers as an etch mask.

5 Claims, 4 Drawing Sheets

SELF-ALIGNED BIPOLAR SEMICONDUCTOR DEVICE AND FABRICATION METHOD THEREOF

CROSS REFERENCE TO RELATED APPLICATIONS

This U.S. non-provisional application claims priority under 35 U.S.C. §119 from Korean Patent Application No. 2004-117847, which was filed in the Korean Intellectual Property Office on Dec. 31, 2004, the contents of which are incorporated by reference herein in its entirety.

BACKGROUND OF THE INVENTION

1. Field of the Invention

The present invention relates generally to semiconductor integrated circuit (IC) technology and, more particularly, to a self-aligned bipolar semiconductor device and a fabrication method thereof.

2. Description of the Related Art

In comparison with typical MOS (metal oxide semiconductor) devices, BJT (bipolar junction transistor) devices have some advantages of relatively better current performance and higher operating speed. Hence the use of BJT devices is on an increasing trend in various branches of semiconductor IC technologies.

Additionally, HBT (heterojunction bipolar transistor) devices are superior in high speed and high frequency properties to conventional BJT devices as well as MESFET (metal semiconductor field effect transistor). In HBT devices, a band gap difference between a base and an emitter restrains the movement of holes from the base to the emitter, thus improving emitter injection efficiency and current gain.

Silicon germanium (SiGe) HBT devices, recently used for high frequency transistors, have a SiGe base with lower band gap rather than typical a Si base. SiGe HBT devices are therefore improved in current gain and operating speed. Furthermore, in SiGe HBT devices, current gain is not reduced and base resistance is decreased even if impurity concentration is increased. So SiGe HBT devices have favorably reduced figure of noise and low power consumption due to low operating voltage.

One of the important points to be considered in fabrication of BJT or HBT devices is to correct mask misalignment and thereby to shorten a distance between the base and the emitter. This is required not only to remove parasitic resistance and parasitic capacitance, but also to increase maximum oscillation frequency ($f_{max}$) and cut-off frequency ($f_T$).

Generally, semiconductor fabrication in a self-aligned manner allows simplification of processes, reductions in production cost and time, and scaling down of devices. For example, fabrication of self-aligned bipolar transistors does not need some mask processes traditionally used. This may not only solve problems due to mask misalignment, but also reduce device size. So this may shorten a distance between adjacent devices and also improve device performance.

Several self-aligning techniques for semiconductor fabrication have been therefore widely studied in this art. Two examples are to selectively grow an epitaxial layer and to employ a difference of etch rate.

The selective growth of the epitaxial layer is, however, susceptible to quality and shape of a fundamental substrate. Furthermore, since the epitaxial layer grows isotropically, the growth of the epitaxial layer may invite electrical short-circuit between adjacent devices.

On the other hand, a technique using a difference of etch rate needs selective oxidation for offering such etch rate differences. This may unfavorably induce complex processes, a reduction in active regions due to bird's beak, variation of impurity concentration due to lengthy thermal process, an increase in leakage current due to stress occurring in selective oxidation.

SUMMARY OF THE INVENTION

Exemplary, non-limiting embodiments of the present invention provide a self-aligned bipolar semiconductor device and a fabrication method thereof.

According to one exemplary embodiment of the present invention, the method comprises forming a silicon layer and a collector contact on a buried collector layer, and forming an oxide dummy pattern on the silicon layer. The oxide dummy pattern defines both an extrinsic base and an intrinsic base.

The method further comprises forming a polycide layer on the resultant structure having the dummy pattern, selectively removing the polycide layer such that the dummy pattern is exposed, and completely removing the exposed dummy pattern such that the silicon layer is exposed. The polycide layer is used as the extrinsic base.

The method still further comprises growing an epitaxial layer on both the exposed silicon layer and the polycide layer, and removing the epitaxial layer from the top of the polycide layer. The epitaxial layer is used as the intrinsic base.

The method also comprises conformally depositing an oxide layer and a nitride layer in sequence on both the extrinsic base and the intrinsic base, blanket-etching the nitride layer to form spacers defining an emitter, forming a photoresist pattern to mostly cover the oxide layer and partly expose the oxide layer between the spacers over the intrinsic base, etching the oxide layer by using the photoresist pattern and the spacers as an etch mask, and forming the emitter connected to the intrinsic base.

In the method, the epitaxial layer can be formed of silicon or silicon germanium. The selectively removing of the polycide layer can be performed by CMP process.

BRIEF DESCRIPTION OF THE DRAWINGS

FIGS. 1 to 8 are cross-sectional views showing a method of fabricating a self-aligned bipolar semiconductor device in accordance with an exemplary embodiment of the present invention, wherein:

FIG. 1 shows a silicon layer and a collector contact on a buried collector layer;

FIG. 2 shows an oxide dummy pattern on the silicon layer;

FIG. 3 shows a polycide layer to be used as an extrinsic base;

FIG. 4 shows the polycide layer selectively removed;

FIG. 5 shows an epitaxial layer to be used as an intrinsic base on both the silicon layer and the polycide layer;

FIG. 6 shows an oxide layer and a nitride layer on both the extrinsic base and the intrinsic base;

FIG. 7 shows a nitride spacers and a photoresist pattern both defining an emitter; and FIG. 8 shows the emitter connected to the intrinsic base.

DETAILED DESCRIPTION OF EXEMPLARY EMBODIMENTS OF THE INVENTION

An exemplary, non-limiting embodiment of the present invention will now be described more fully hereinafter with reference to the accompanying drawings. This invention can, however, be embodied in many different forms and should not be construed as limited to the exemplary embodiment set forth herein. Rather, the disclosed embodiment is provided so that this disclosure will be thorough and complete, and will fully convey the disclosure of the invention to those skilled in the art. The principles and features of this invention can be employed in varied and numerous embodiments without departing from the scope of the invention.

In is noted that well-known structures and processes are not described or illustrated in detail to avoid obscuring the essence of the present invention. It is also noted that the figures are not drawn to scale.

FIGS. 1 to 8 are cross-sectional views showing a method of fabricating a self-aligned bipolar semiconductor device in accordance with an exemplary embodiment of the present invention.

Figure 1:
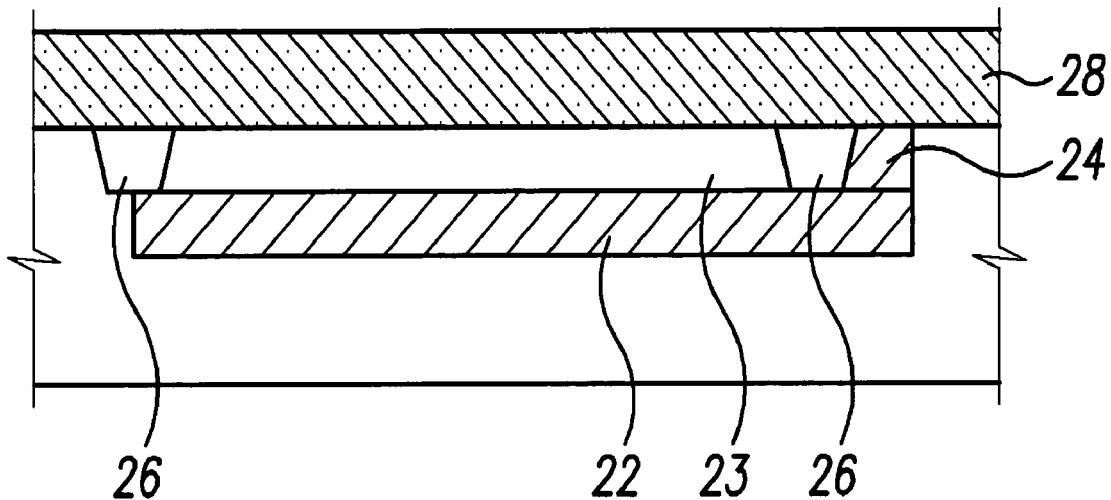

Referring to FIG. 1, after a buried collector layer 22 is formed in a substrate, a silicon layer 23 and a collector contact 24 are formed and an oxide layer 28 is coated thereon. The oxide layer 28 can be a silicon oxide layer. Before the oxide layer 28 is coated, a suitable isolation structure 26 is formed by using a typical STI (shallow trench isolation) technique.

Figure 2:
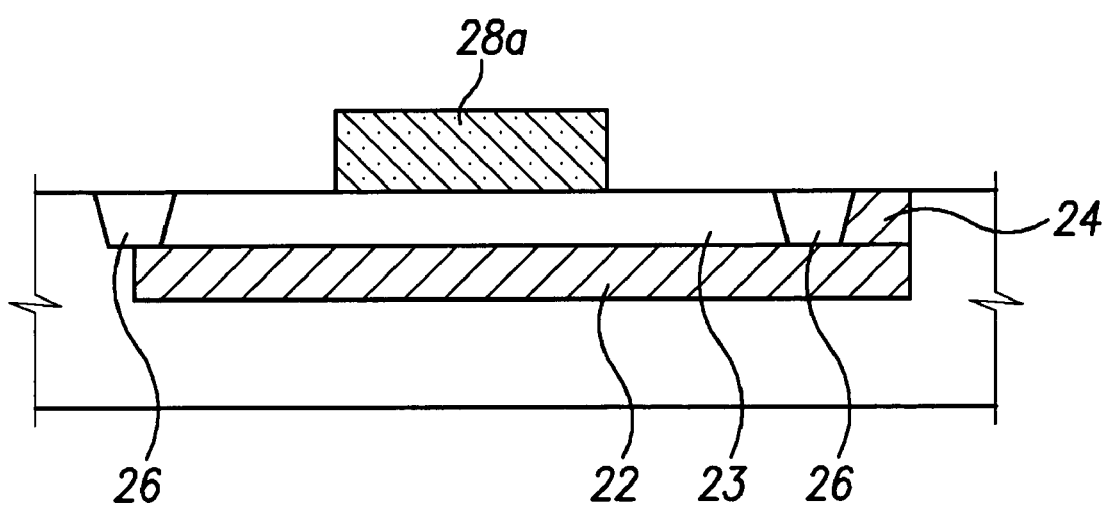

Next, as shown in FIG. 2, the oxide layer is etched to form a dummy pattern 28a that will define an extrinsic base and an intrinsic base. The thickness of the oxide layer depends on that of the extrinsic base formed later. Such thickness, one of factors determining the magnitude of base resistance, can affect device characteristics such as cut-off frequency, figure of noise, surface recombination current, parasitic resistance, parasitic capacitance, etc. The oxide layer can have a thickness of about 2000 Å, for example, in consideration of the above characteristics.

Figure 3:
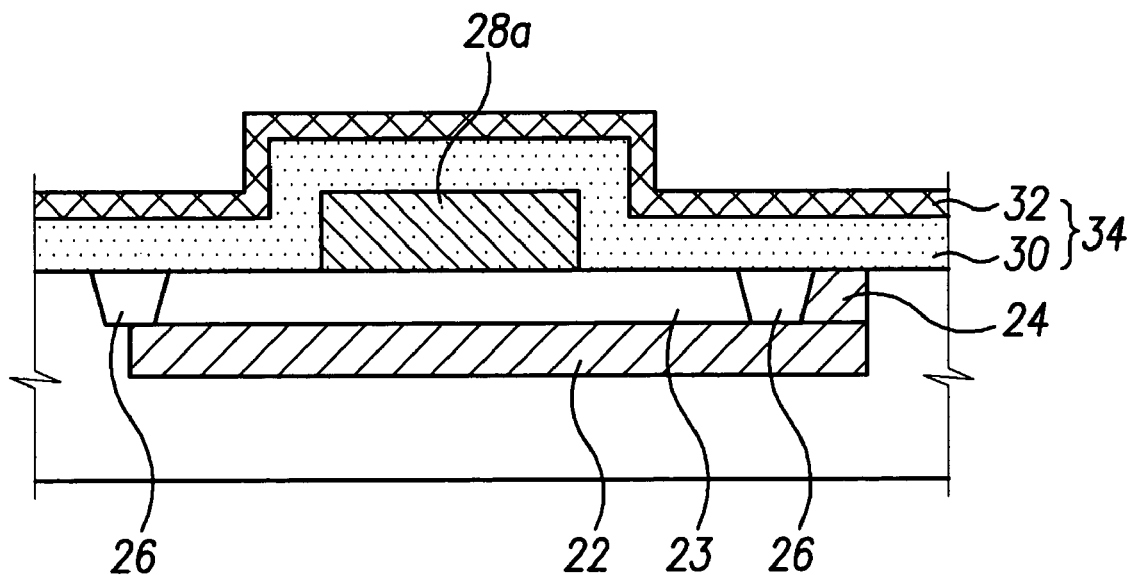

Next, as shown in FIG. 3, a polysilicon layer 30 is coated on the resultant structure having the dummy pattern 28a and a suitable metal layer is deposited thereon. In the subsequent heat treatment, the metal layer reacts with the polysilicon layer 30 and creates a silicide layer 32. A resultant polycide layer 34, composed of the polysilcon layer 30 and the silicide layer 32, will be used as the extrinsic base. The polycide base has much lower resistance than any other bases typically formed of polysilicon.

Like the oxide layer, the polysilicon layer 30 can have a thickness of about 2000 Å, for example. The metal layer for the silicide layer 32 can be formed of metal suitable for heat treatment, for example, titanium, cobalt, nickel or any other alternative materials. Before the metal layer is deposited, the polysilicon layer 30 is subjected to ion implantation for further reducing resistance. For example, in case of a NPN type device with excellent high frequency properties, p-type dopants are implanted into the polysilicon layer 30 for the base.

Figure 4:
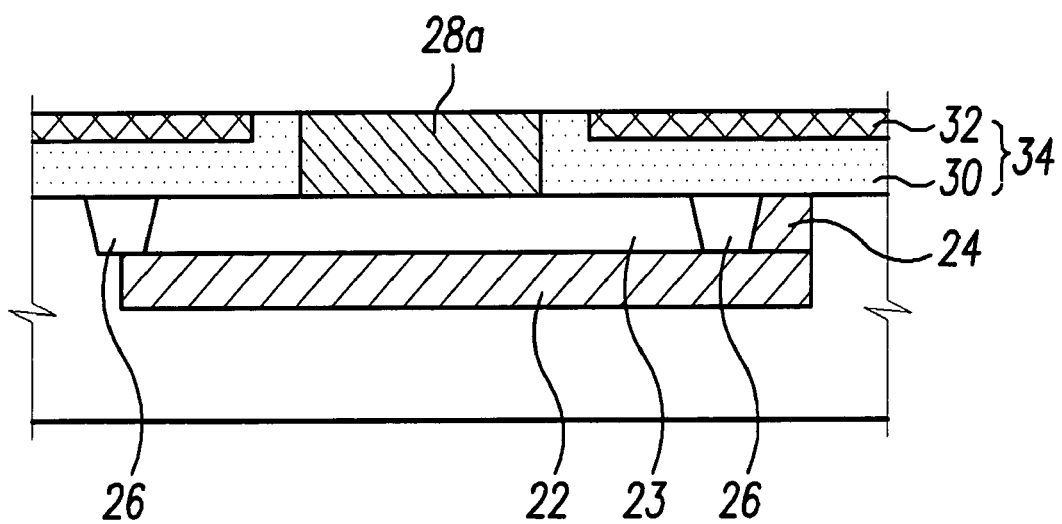

Subsequently, as shown in FIG. 4, a planarization process such as CMP (chemical mechanical polishing) is performed on the polycide layer 34 until the dummy pattern 28a is exposed. Through CMP process, the polycide layer 34 is selectively removed and the dummy pattern 28a is exposed. Then the exposed dummy pattern 28a is completely removed using hydrogen fluoride (HF), and the underlying silicon layer 23 is exposed instead. Here a space from which the dummy pattern 28a is removed will be used for the intrinsic base formed later.

Figure 5:
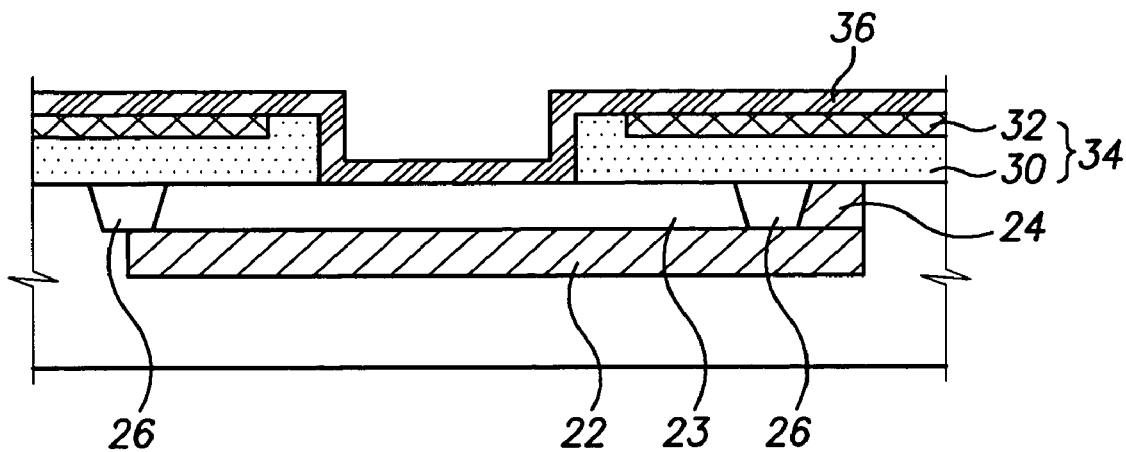

Next, as shown in FIG. 5, an epitaxial layer 36 is wholly grown on both the silicon layer 23 and the polycide layer 34. Contrary to the selective growth in a conventional method, such whole growth of the epitaxial layer 36 is little affected by quality and shape of the fundamental layers 23 and 34. Additionally, the isotropic growth of the epitaxial layer 36 is no matter any more. In this step a BJT device employs silicon implanted with p-type dopants for the epitaxial layer 36, whereas a HBT device does silicon germanium for the epitaxial layer 36.

Figure 6:
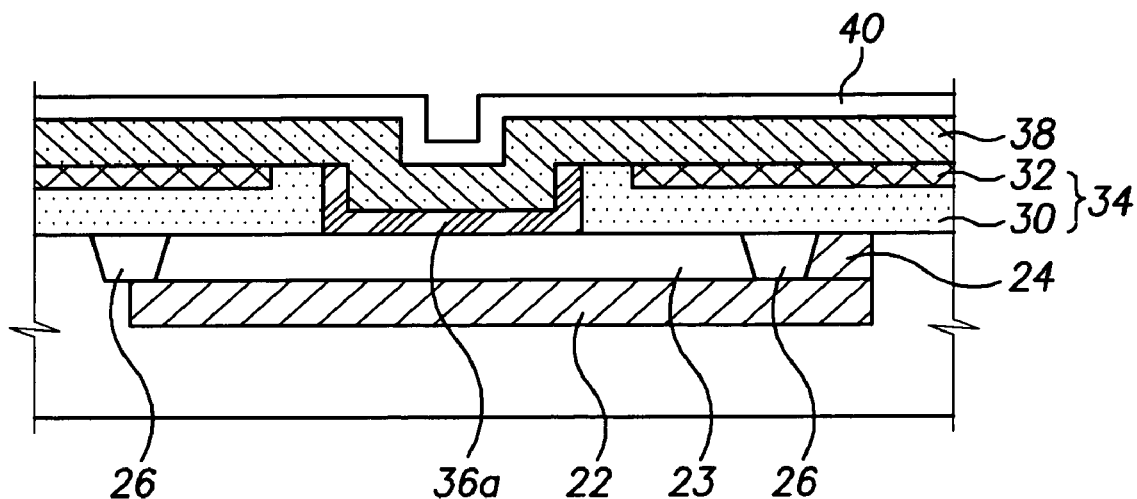

Next, as shown in FIG. 6, the epitaxial layer is removed from the top of the polycide layer 34. Remaining parts of the epitaxial layer form the intrinsic base 36a. Then an oxide layer 38 and a nitride layer 40 are conformally deposited in sequence on both the extrinsic base 34 and the intrinsic base 36a. The oxide layer 38 and the nitride layer 40 can use silicon oxide and silicon nitride, for example. In this case, since the silicon nitride layer 40 has insufficient etch selectivity to silicon, the silicon oxide layer 38 is used as a buffer layer for etching the silicon nitride layer.

Figure 7:
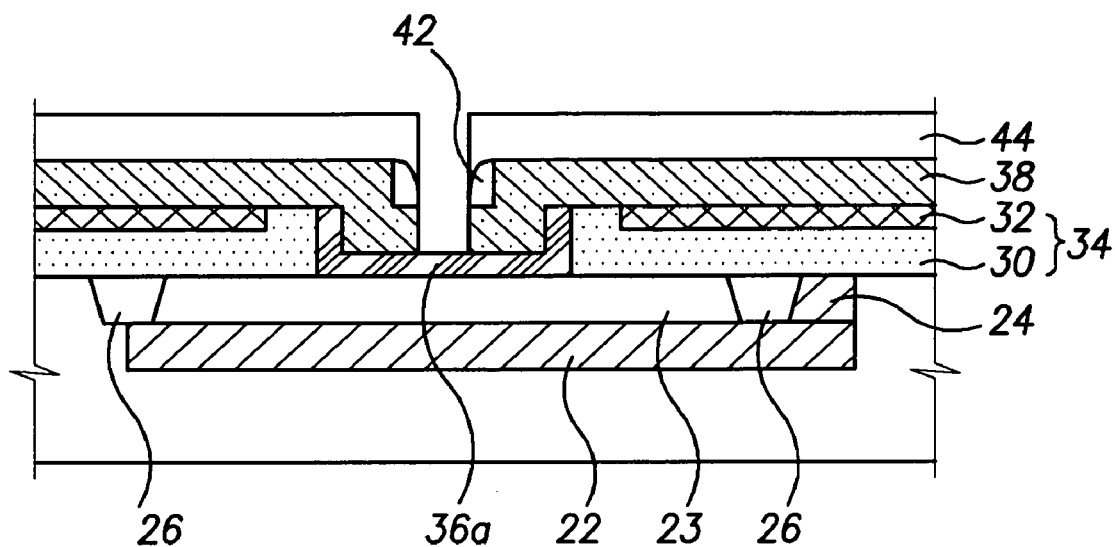

Next, as shown in FIG. 7, the nitride layer is blanket-etched to form spacers 42. Then a photoresist pattern 44 is formed to mostly cover the oxide layer 38 and partly expose the oxide layer 38 between the spacers 42 over the intrinsic base 36a. With the photoresist pattern 44 and the spacers 42 used together as an etch mask, the oxide layer 38 is removed by etching between the spacers 42. Here the nitride spacer 42 defines an area where the emitter will be formed.

Figure 8:
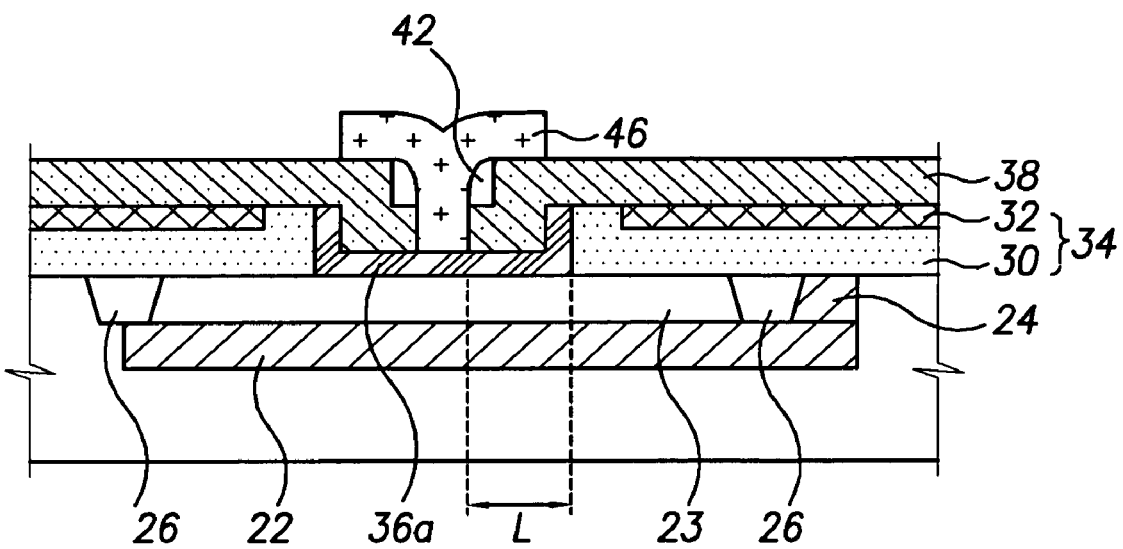

After the photoresist pattern is stripped, as shown in FIG. 8, the emitter 46 is formed on the resultant structure and connected to the intrinsic base 36a. In case of NPN type device, the emitter 46 can be formed of silicon with n-type dopants implanted.

A distance (L) between the extrinsic base 34 and the emitter 46 determines the magnitude of base resistance, a reduction of which can improve device characteristics such as cut-off frequency and operating speed. In addition, this distance (L) is determined in a self-aligned manner, instead of a separate mask conventionally used, during the CMP process. Normally, this distance (L) depends on the dummy pattern 28a, the oxide layer 38 and the nitride spacer 42.

In a preferred case where the dummy pattern 28a has a thickness of about 2000 Å, the oxide layer 38 and the nitride layer 40 can have a thickness of about 300 Å and about 700 Å, respectively. Here the distance (L) between the extrinsic base 34 and the emitter 46 can be adjusted between 50 nm and 70 nm by regulating a width of the nitride spacer 42.

While this invention has been particularly shown and described with reference to an exemplary embodiment thereof, it will be understood by those skilled in the art that various changes in form and details can be made therein without departing from the spirit and scope of the invention as defined by the appended claims.

What is claimed is:

1. A method of fabricating a semiconductor device, the method comprising:

forming a silicon layer and a collector contact on a buried collector layer;

forming an oxide dummy pattern on the silicon layer, the oxide dummy pattern defining an extrinsic base and an intrinsic base;

forming a polycide layer on the resultant structure having the dummy pattern, the polycide layer being used as the extrinsic base;

selectively removing the polycide layer such that the dummy pattern is exposed;

completely removing the exposed dummy pattern such that the silicon layer is exposed;

growing an epitaxial layer on both the exposed silicon layer and the polycide layer, the epitaxial layer being used as the intrinsic base;

removing the epitaxial layer from a top of the polycide layer;

conformally depositing an oxide layer and a nitride layer in sequence on both the extrinsic base and the intrinsic base;

blanket-etching the nitride layer to form spacers defining an emitter;

forming a photoresist pattern to mostly cover the oxide layer and partly expose the oxide layer between the spacers over the intrinsic base;

etching the oxide layer by using the photoresist pattern and the spacers as an etch mask; and forming the emitter connected to the intrinsic base.

2. The method of claim 1, wherein the epitaxial layer is formed of silicon.

3. The method of claim 1, wherein the epitaxial layer is formed of silicon germanium.

4. The method of claim 1, wherein the selectively removing of the polycide layer is performed by CMP process.

5. A semiconductor device fabricated by the method set forth in claim 1.

* * * * *